(12) United States Patent
Lo et al.

(10) Patent No.: US 8,211,805 B2
(45) Date of Patent: Jul. 3, 2012

(54) METHOD FOR FORMING VIA

(75) Inventors: Wen-Shun Lo, Hsinchu County (TW); Hsing-Chao Liu, Hsinchu County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 392 days.

(21) Appl. No.: 12/371,105

(22) Filed: Feb. 13, 2009

(65) Prior Publication Data

US 2010/0210113 A1 Aug. 19, 2010

(51) Int. Cl.
*H01L 21/302* (2006.01)

(52) U.S. Cl. ........ 438/713; 438/706; 438/710; 438/712; 438/714; 438/723; 438/734; 216/58; 216/67; 216/72; 216/74

(58) Field of Classification Search .................. None
See application file for complete search history.

(56) References Cited

U.S. PATENT DOCUMENTS

| | | | | |
|---|---|---|---|---|
| 6,013,579 A | * | 1/2000 | Wang et al. | 438/692 |
| 6,020,258 A | * | 2/2000 | Yew et al. | 438/634 |
| 6,074,959 A | * | 6/2000 | Wang et al. | 438/738 |
| 6,635,185 B2 | * | 10/2003 | Demmin et al. | 216/64 |
| 2001/0014528 A1 | * | 8/2001 | Tsai | 438/637 |

OTHER PUBLICATIONS

Wolf S. and Tauber R.N., Silicon Processing, vol. 1, published by Lattice Press, 2000, section 14.1.1, pp. 676-678, ISBN0-9616721-6-1).*
Xiao H., Introduction to Semiconductor Manufacturing Technology, published by Prentice Hall, 2001, pp. 328-356, ISBN 0-13-022404-9.*
Schaepkens M. et.al., Journal Vacuum Science and Technology B, vol. 18 (2), 2000, pp. 848-855.*
S. Wolf and R.N. Tauber, Silicon Processing, pp. 724, vol. 1, Lattice Press, 2000, ISBN0-9616721-6-1.*

* cited by examiner

*Primary Examiner* — Lan Vinh
*Assistant Examiner* — Jiong-Ping Lu

(57) ABSTRACT

The invention provides a method for forming a via. A first dielectric layer is formed on a substrate. A conductive structure is formed in the first dielectric layer. A second dielectric layer is formed on the first dielectric layer and conductive structure. A first etching step is performed by using a first etching mixture to form a first via in the second dielectric layer. A second etching step is performed by using a second etching mixture to form a second via under the first via. The second via exposes at least a top surface of the conductive structure. An etching rate of the second etching step is slower than the first etching step.

19 Claims, 5 Drawing Sheets

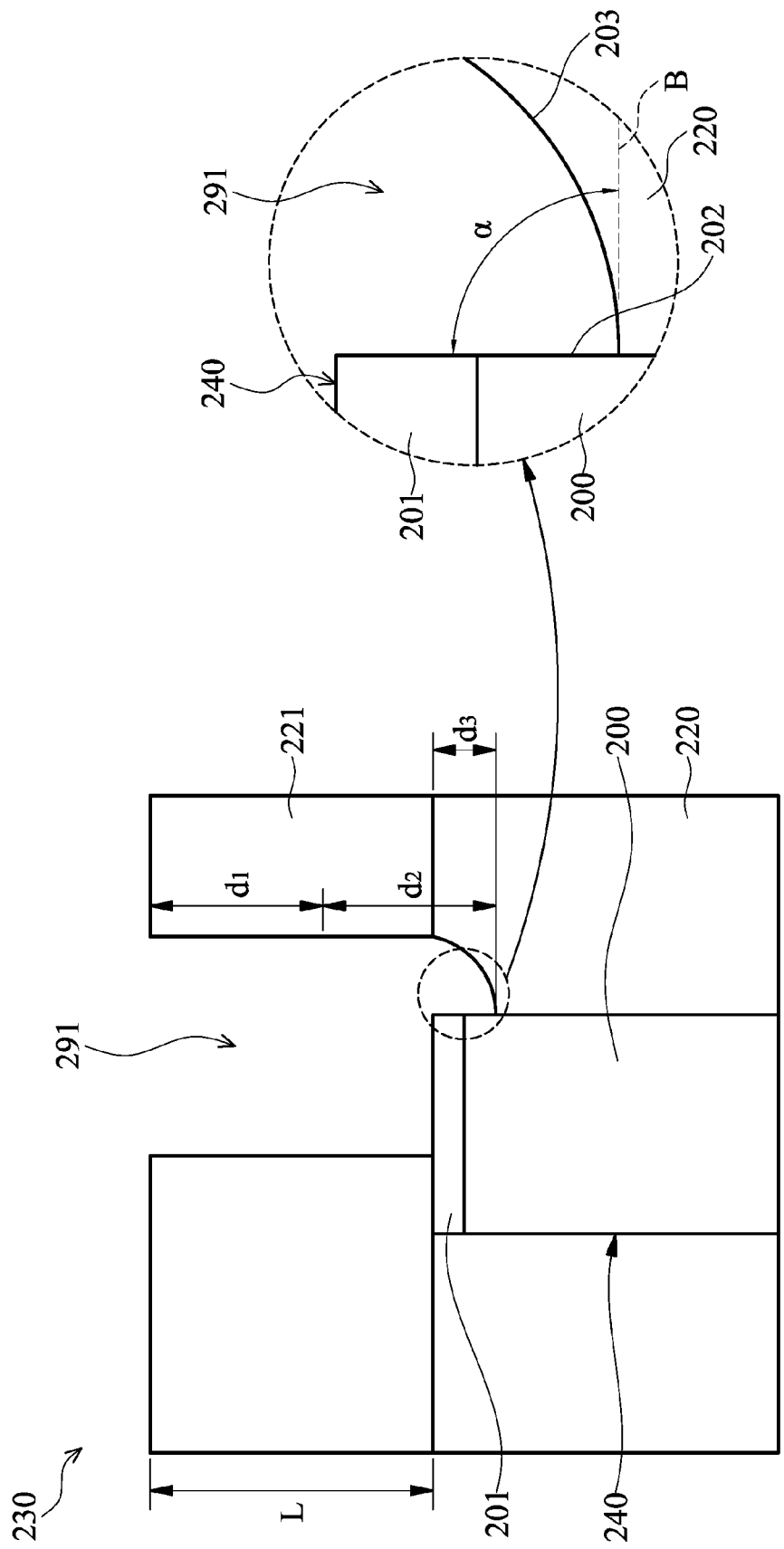

METHOD FOR FORMING VIA

BACKGROUND OF THE INVENTION

1. Field of the Invention

The present invention relates to semiconductor manufacturing, and in particular relates to a method for forming a via.

2. Description of the Related Art

The plasma etching technique and methods thereof, was first used to manufacture devices in 1970. And its principle has been understood and realized. For present integrated circuit manufacturing, various materials used must have the capability to be appropriately controlled at sub-micro levels with high reproducibility. Since the plasma etching method is the only effective way for etching that can be performed with high productivity, it is still a major method used in integrated circuit manufacturing.

The plasma etching method has advantages of anisotropism and having a high selective ratio. In the plasma etching process, the high selective ratio is achieved due to chemical reaction. Re-deposited production or polymer is formed on the expected etched pattern. A portion of the deposition, formed on the surface of the pattern, is continuously removed by ions, and thus etched. A portion of the deposition, formed on the side wall of the pattern is maintained to prevent ions from etching the side wall of the pattern. Therefore, achieving anisotropic etching. Plasma etching is a popular method for forming a high aspect ratio via needed for present integrated circuit devices. By using the physical attacking and chemical etching effects, controlled by plasma conditions and gas chemical compounds, the desired anisotropic and selective etching method can be used to obtain a via with vertical side walls.

However, due to demand for even lower scale and higher density integrated circuit fabrication, it is possible, when using the conventional plasma etching method, for a un-landing via 190 to be formed on a top surface of a conductive structure 100 as shown in FIG. 1A. The effect results from a discrepancy in disposition of the via due to a slight shift in the mask pattern. The un-landing via 190 causes a micro-trench 191 in a dielectric layer 120. FIG. 1B shows an enlarged view of the micro-trench 191. An angle θ between the bottom 102 (which is adjoined with the conductive structure, and has a tangent line A) of the micro-trench 191 and the sidewall 101 of the conductive structure is small (between about 5° to about 40°).

Thus, the micro-trench 191 easily becomes a dead space for subsequent material deposition processes. In addition, etched residue or impurities deposited in the micro-trench 191 can not be easily removed.

Furthermore, for etching a via with a desired depth, or avoiding insufficient depth of the via, parameters, according to the conventional etching method, are set according to the condition for forming a via with a depth deeper than the desired value. Referring to FIG. 1A, the via 190, formed by the conventional etching method, has a deep depth. Thus, a big area portion of the sidewall of the conductive structure 100 is exposed in the etching environment, resulting in increased destructible ratio of the conductive structure 100. Therefore, influencing the electric property such as electromigration reliability or RC of the device.

The conventional etching method has limited application when demanding high precision features and excellent electric properties of devices. As such, a novel fabrication method for forming a via is needed.

BRIEF SUMMARY OF INVENTION

A detailed description is given in the following embodiments with reference to the accompanying drawings.

The invention provides a method for forming a via. A first dielectric layer is formed on a substrate. A conductive structure is formed in the first dielectric layer. A second dielectric layer is formed on the first dielectric layer and conductive structure. A first etching step is performed by using a first etching mixture to form a first via in the second dielectric layer. A second etching step is performed by using a second etching mixture to form a second via under the first via. The second via exposes at least a top surface of the conductive structure. An etching rate of the second etching step is slower than the first etching step.

BRIEF DESCRIPTION OF DRAWINGS

The present invention can be more fully understood by reading the subsequent detailed description and examples with references made to the accompanying drawings, wherein:

FIGS. 2A to 2D are cross-section views illustrating an embodiment of the method for fabricating a via.

DETAILED DESCRIPTION OF INVENTION

Figures 1A, 1B:
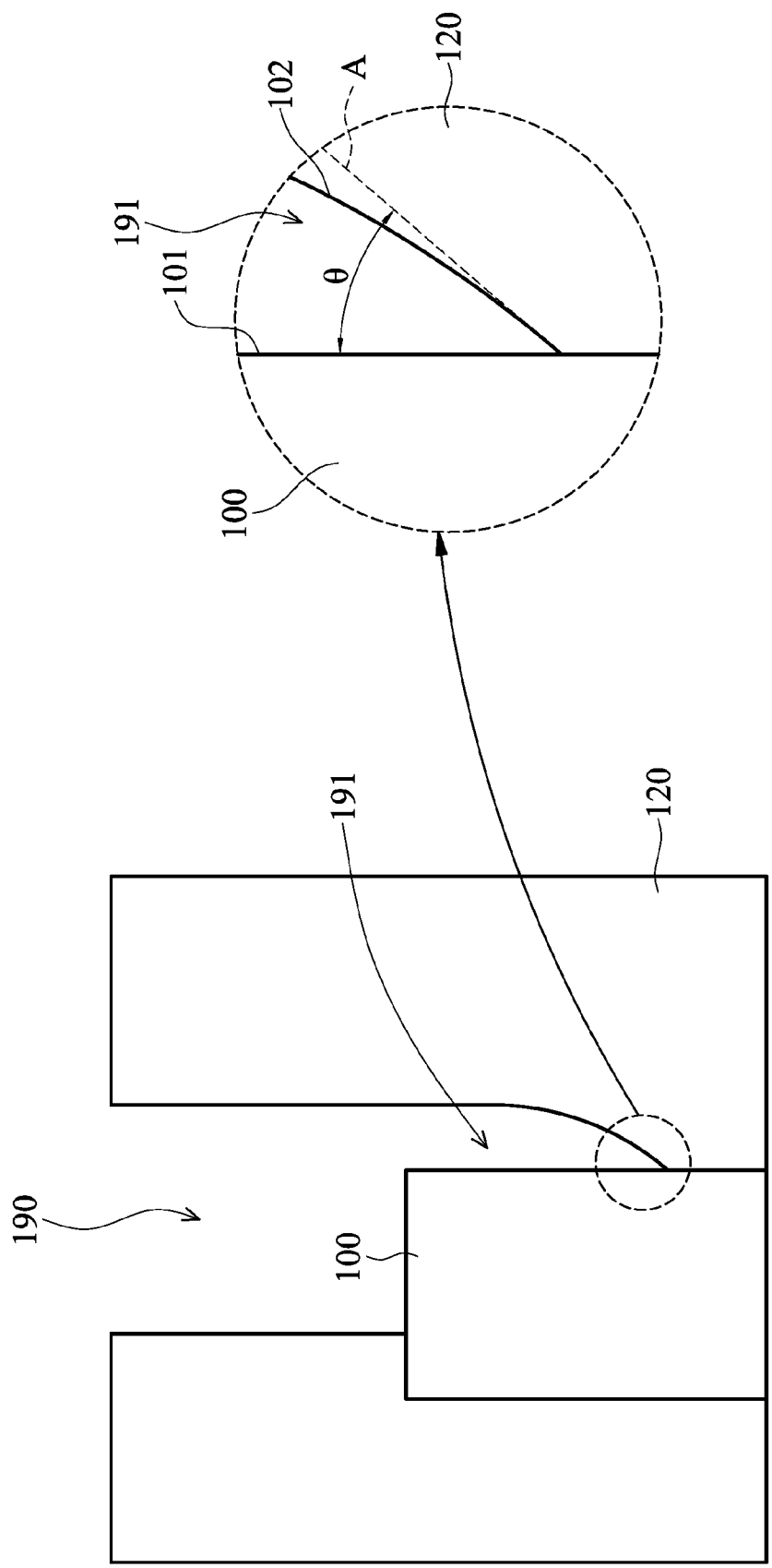
FIG. 1 is a cross-section view illustrating a semiconductor device as known in the art.

The following description is of the best-contemplated mode of carrying out the invention. This description is made for the purpose of illustrating the general principles of the invention and should not be taken in a limiting sense. The scope of the invention is best determined by reference to the appended claims.

Embodiments of the present invention provide a method for forming a via. References will be made in detail to the present embodiments, examples of which are illustrated in the accompanying drawings. Wherever possible, the same reference numbers are used in the drawings and the descriptions to refer to the same or like parts. In the drawings, the shape and thickness of one embodiment may be exaggerated for clarity and convenience. The descriptions will be directed in particular to elements forming a part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Figure 2A:
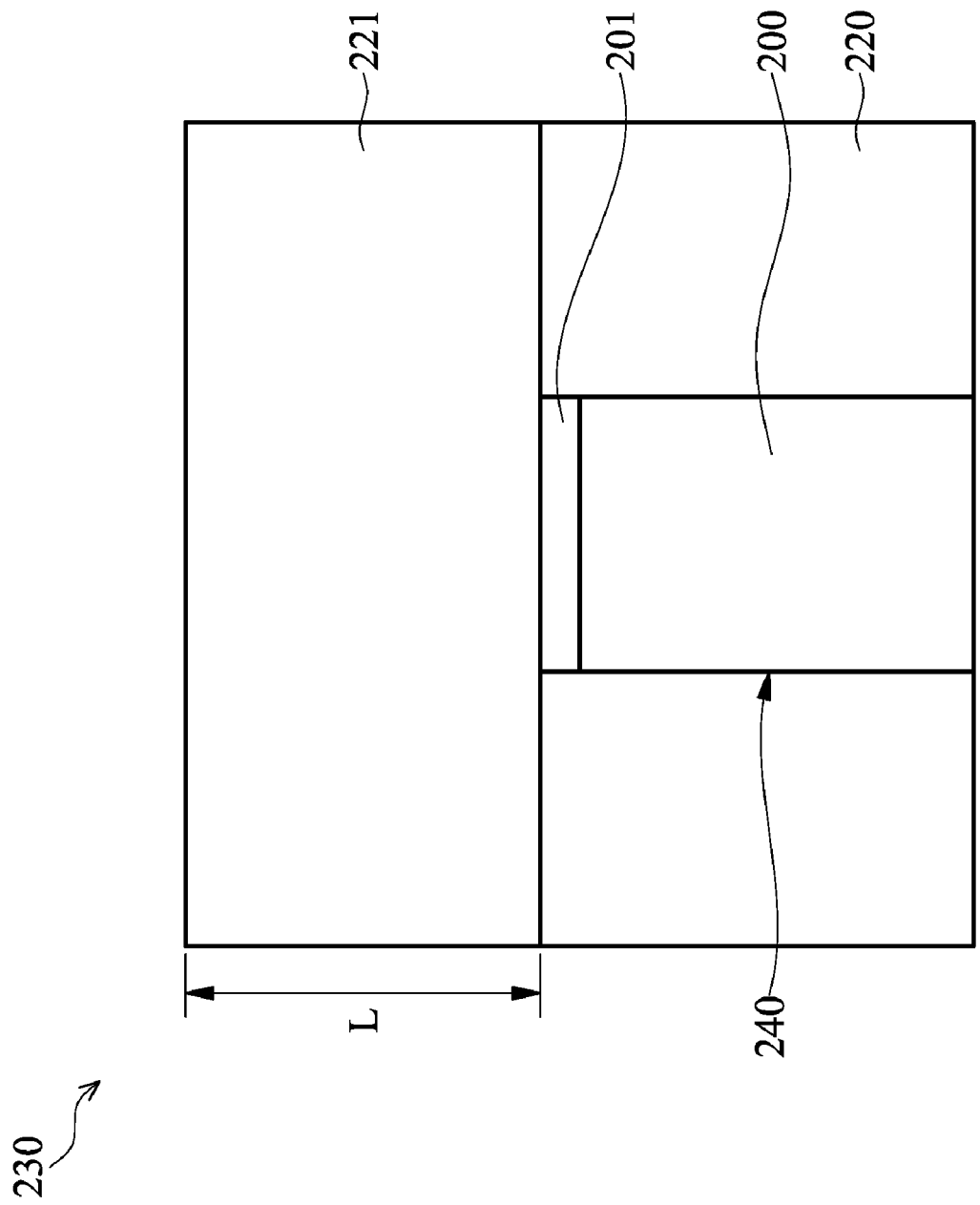

FIGS. 2A to 2D are cross-section views illustrating an embodiment of the method for forming a via. Referring to FIG. 2A, first, a substrate 230 is provided. The substrate 230 comprises a first dielectric layer 220. A conductive structure 240 is disposed in the first dielectric layer 220. The conductive structure 240 comprises a metal layer 200 and a barrier layer (or anti-reflective layer) 201 on the metal layer 200. In one embodiment, the metal layer 200 is AlCu, and the barrier layer (or anti-reflective layer) 201 is TiN. The first dielectric layer 220 and the conductive structure 240 are covered by the second dielectric layer 221. The second dielectric layer 221 has a thickness L. The first dielectric layer 220 or second dielectric layer 221 may be a silicon oxide ($Si_xO_y$), oxygen doped spin-on glass, low-k organic or inorganic material, or other suitable dielectric materials. In one embodiment, the first dielectric layer 220 and the second dielectric layer 221 are both silicon oxide ($Si_xO_y$).

Figure 2B:
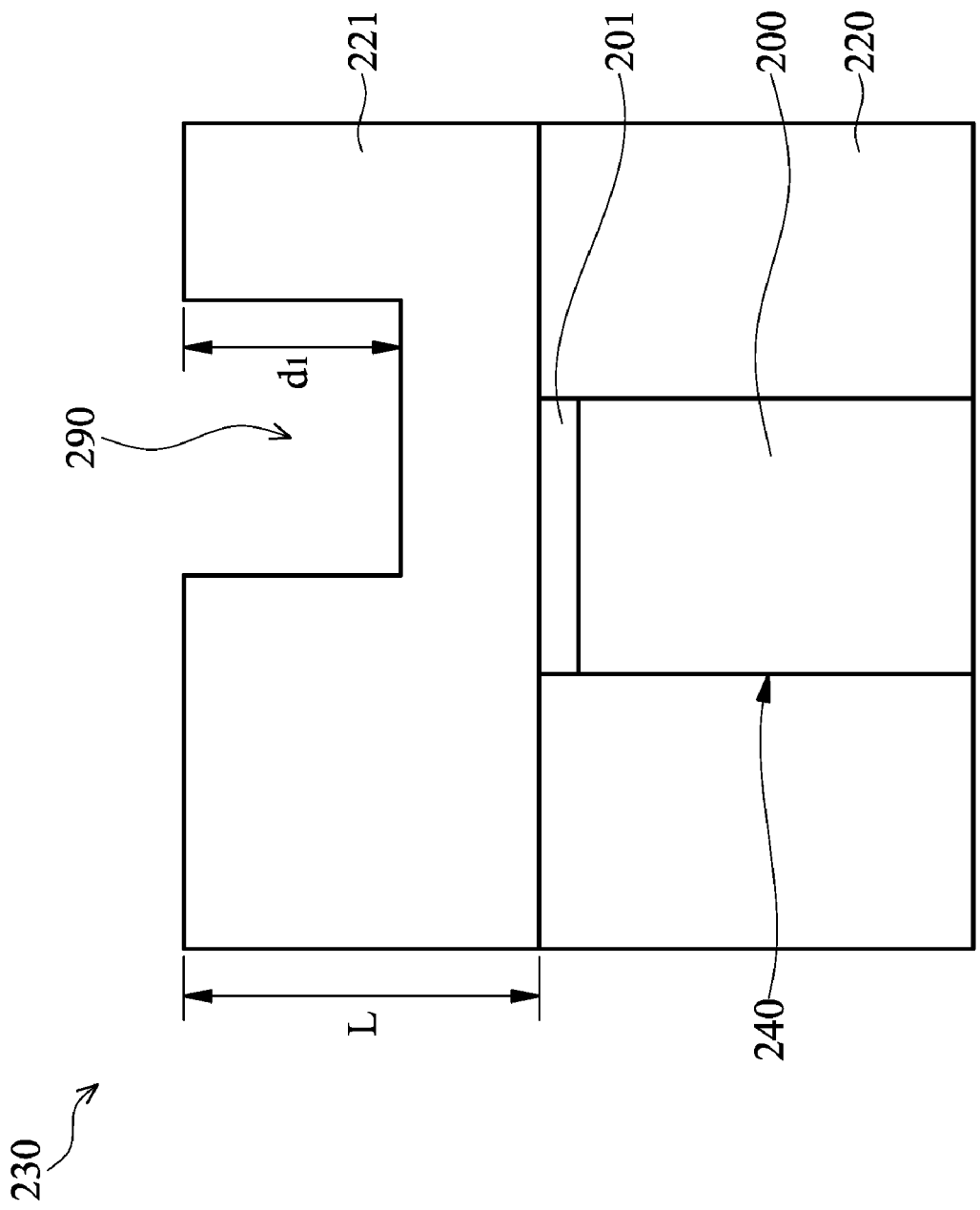

Referring to FIG. 2B, in the first etching step, the substrate 230 is etched to form a first via 290 in the second dielectric layer 221 on the conductive structure 240 by leading a first etching mixture gas into a chamber of a plasma etching device. A depth d1 of the first via 290 is 80-100% of the thickness L of the second dielectric layer 221. In an alternate embodiment, a depth d1 of the first via 290 is 30-80% of the thickness L of the second dielectric layer 221.

The first etching mixture gas includes a fluorocarbon, a carbon oxide, an argon, and an oxygen. The fluorocarbon includes an octafluoroisobutene (C4F8), CHF3, C2F6, C2F4, or C3F6. The fluorocarbon flow rate may be 8-18 sccm. The carbon oxide includes a CO. The carbon oxide flow rate may be 20-200 sccm. The argon flow rate may be 100-300 sccm. The oxygen flow rate may be 1-15 sccm. A bias power of the first etching step is 1000-2000 W. A temperature of the first etching step is 5-35° C. A pressure of the first etching step is 10-50 mT. In one embodiment, in the first etching step, the pressure is 30 mT, the power is 1500 W, and the temperature is 20° C. Moreover, the first etching mixture gas comprises the octafluoroisobutene with flow rate of 12 sccm, CO with flow rate of 50 sccm, argon with flow rate of 200 sccm, and oxygen with flow rate of 5 sccm.

Figure 2C:
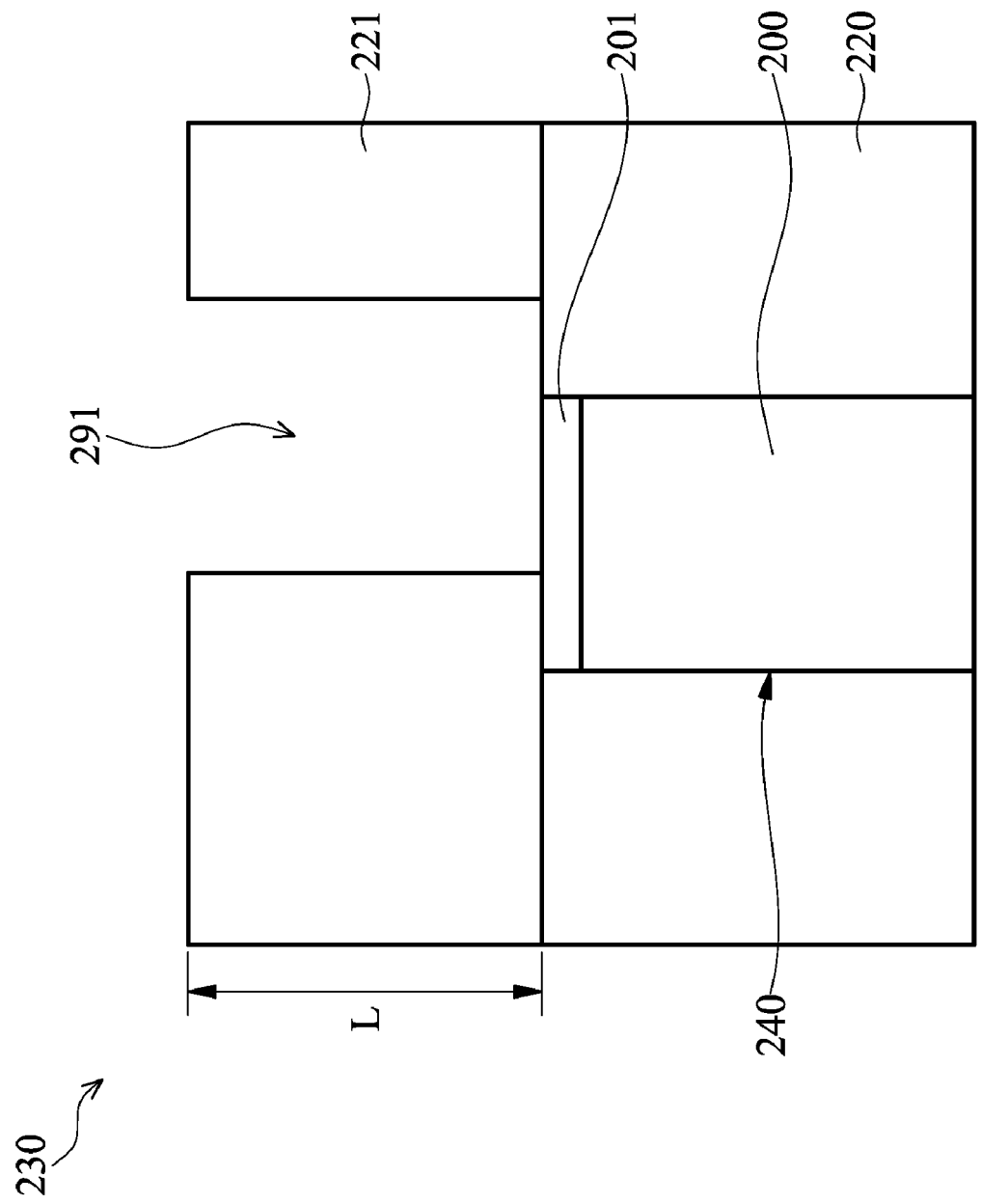

Referring to FIGS. 2C to 2D, after stopping the first etching mixture gas, in the second etching step, the substrate 230 is etched to form a second via 291 of a depth d2, under the first via 290, by leading a second etching mixture gas into the chamber of the plasma etching device. The etching rate of the second etching step is slower than the etching rate of the first etching step. The second etching mixture gas includes the fluorocarbon, the carbon oxide, and the argon. It is noted that the flow rates of the fluorocarbon and the carbon oxide of the second etching mixture gas are higher than those of the first etching mixture gas. The first etching mixture includes the oxygen. However, the etching mixture does not include any oxygen. Moreover, in the preferred embodiment, the pressure of the second etching step is higher than that of the pressure of the first etching step.

The fluorocarbon flow rate of the second etching mixture gas may be 11-19 sccm. The carbon oxide flow rate may be 100-200 sccm. The argon flow rate may be 150-380 sccm. In the second etching step, the pressure is 20-60 mT. The bias power is 1000-2000 W. The temperature is 5-35° C. In one embodiment, in the second etching step, the pressure is 40 mT, the bias power is 1500 W, and the temperature is 20° C. Moreover, the second etching recipe comprises the octafluoroisobutene with flow rate of 15 sccm, CO with flow rate of 150 sccm, and argon with flow rate of 200 sccm.

In the plasma etching process, a portion of the plasma formed from the etching mixture gas etches the dielectric material. In addition, a portion of the plasma formed from the etching mixture gas is reacted with the dielectric layer exposed in the etching environment to form a gas reaction product. A portion of the polymer of the gas reaction product is deposited in the inner of the via. A portion of the material of the gas reaction product in the etching environment is decomposed into the plasma to etch the dielectric material.

Referring to FIG. 2C, in the process for etching the second via 291, the area of the first dielectric layer 220 exposed in the bottom of the via is decreased by removing the second dielectric layer 221 under the first via 290, till the top surface of the conductive structure 240 and first dielectric layer 220 are exposed, thus decreasing the amount of the dielectric layer that reacts with the plasma when forming a plasma. Furthermore, in contrast with the first etching mixture gas, the second etching mixture gas produces much polymer when reacting with the dielectric layer, thus increasing the depositing rate of the polymer deposited on the dielectric layer. Therefore, after exposing the barrier layer (or anti-reflective layer) 201, the etching rate of the via is gradually slowed down, till an equilibrium of the depositing rate of the polymer and the etching rate of the dielectric layer is reached. Note that the depth of the via is not substantially increased or changed, even if the plasma etch device proceeds with the etching process. In addition, in contrast to the first etching mixture gas, the second etching mixture gas has a higher selectivity to the barrier layer (or anti-reflective layer) 201 or metal layer 200. Thus, when etching first dielectric layer 220 for forming the second via 291, the barrier layer (or anti-reflective layer) 201 or metal layer 220 maintains thickness and uniformity without being further etched and destroyed.

Referring to FIG. 2D-1, the second via 291 has a shallow depth d3, below the top surface of the barrier layer (or anti-reflective layer) 201. In other words, the sidewall area of the conductive structure 240 exposed in the etching environment is small. Therefore, damage caused from etching of the conductive structure 240, influencing the electric properties of the device, is avoided.

FIG. 2D-2 is an enlarged view of the bottom of the second via 291. An angle α between the bottom 203 (which is adjoined with the conductive structure 240, and has a tangent line B) of the second via 291 and the sidewall 202 of the conductive structure is large. The angle α is between about 45° to about 100°. The preferred α is between about 60° to about 90°. Due to the better exposure of bottom surface of the second via 291, etched residues or impurities can be easily removed. In addition, since a dead space is avoided, a subsequent formed barrier layer made up of Ti or TiN, completely covers the inside of the via. Therefore, impurities caused from metal impurity diffusion is efficiently avoided when forming a plug by filling the via with a metal layer, such as Cu, W, or the like metal layers.

The embodiments of the invention have several advantages, for example, a method is provided for forming a via, comprising performing two etching steps to a substrate by using a plasma etching device. The substrate is etched by leading a first and second etching mixture gas into the chamber in the first and second etching step respectively. In contrast to the first etching mixture gas, the second etching mixture gas has a higher selectivity to the barrier layer (or anti-reflective layer) or metal layer. Thus, when etching the second dielectric layer for forming the second via, the barrier layer (or anti-reflective layer) or metal layer maintains thickness and uniformity without being further etched and destroyed.

Furthermore, in contrast with the first etching mixture gas, the second etching mixture gas has a slower etching rate for the dielectric layer. In the etching process, when the exposed area of the dielectric layer in the bottom surface of the via is shrunk, the amount of the dielectric layer, that reacts with the plasma to form a plasma, is decreased. In addition, in contrast with the first etching mixture gas, the second etching mixture gas produces much polymer when reacting with the dielectric layer, thus increasing the depositing rate of the polymer deposited on the dielectric layer. Therefore, after exposing the barrier layer (or anti-reflective layer), the etching rate of the via is gradually slowed down, till an equilibrium of the depositing rate of the polymer and the etching rate of the dielectric layer is reached. The depth of the via is not substantially increased or changed, even if the plasma etch device still proceeds with the etching process.

In the embodiment of the invention, the formed via has a shallow depth, below the top surface of the barrier layer (or anti-reflective layer). Thus, the sidewall area of the conductive structure exposed in the etching environment is small. Therefore, even if the etched via is not perfectly aligned with the conductive structure, the damage caused from etching of the conductive structure, influencing the electric properties of the device, is still avoided. An included angle of the bottom sidewall of the via is large. In other words, the exposed bottom surface of the via is entirely flat. Thus, etched residue or impurities can be easily removed. In addition, subsequent deposited materials completely cover the inside of the via. Thus, the dead space problem is avoided.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for forming a via, comprising:
providing a substrate, comprising:
a first dielectric layer over the substrate;
a first conductive structure in the first dielectric layer; and
a second dielectric layer over the first dielectric layer and the conductive structure;
performing a first etching step by using a first etching recipe for forming a first via in the second dielectric layer; and
performing a second etching step by using a second etching recipe for forming a second via under the first via,
wherein the second via exposes at least a top surface of the conductive structure, and an etching rate of the second etching step is slower than an etching rate of the first etching step,
wherein the second etching step for forming the second via is performed on the first dielectric layer and the second dielectric layer such that the second via has a tapered bottom exposing a side wall of the conductive structure, and
wherein an angle between a tangent of the tapered bottom of the second via at the side wall of the conductive structure and the side wall is 45-100° and a depth of the first via is 30-80% of a thickness of the second dielectric layer.

2. The method for forming the via as claimed in claim 1, wherein the second etching step has a higher selectivity to the conductive structure than that of the first etching step.

3. The method for forming the via as claimed in claim 1, wherein the first etching recipe includes a fluorocarbon, a carbon oxide, and an oxygen, the second etching recipe includes a fluorocarbon and a carbon oxide, but does not include an oxygen, and a fluorocarbon flow rate of the second recipe is greater than a fluorocarbon flow rate of the first recipe.

4. The method for forming the via as claimed in claim 3, wherein the fluorocarbon includes C4F8, CHF3, C2F6, C2F4, or C3F6.

5. The method for forming the via as claimed in claim 3, wherein the fluorocarbon flow rate of the first recipe is 8-18 sccm, the fluorocarbon flow rate of the second recipe is 11-19 sccm.

6. The method for forming the via as claimed in claim 3, wherein a carbon oxide flow rate of the second recipe is greater than a carbon oxide flow rate of the first recipe.

7. The method for forming the via as claimed in claim 6, wherein the carbon oxide flow rate of the second recipe is 100-200 sccm.

8. The method for forming the via as claimed in claim 3, wherein an oxygen flow rate of the first recipe is 1-15 sccm.

9. The method for forming the via as claimed in claim 3, wherein the first or second etching recipe includes an argon.

10. The method for forming the via as claimed in claim 9, wherein an argon flow rate is 150-380 sccm.

11. The method for forming the via as claimed in claim 3, wherein a pressure of the second etching step is higher than a pressure of the first etching step.

12. The method for forming the via as claimed in claim 11, wherein the pressure of the first etching step is 10-50mT, and the pressure of the second etching step is 20-60mT.

13. The method for forming the via as claimed in claim 3, wherein a bias power of the first or second etching step is 1000-2000W.

14. The method for forming the via as claimed in claim 1, wherein the angle between the bottom of the second via and the side wall of the conductive structure is 60-90°.

15. The method for forming the via as claimed in claim 1, wherein the first or second dielectric layer includes silicon oxide.

16. The method for forming the via as claimed in claim 1, wherein the conductive structure comprises a metal layer.

17. The method for forming the via as claimed in claim 16, wherein the conductive structure comprises a barrier layer or anti-reflective layer on the metal layer.

18. The method for forming the via as claimed in claim 17, wherein the metal layer comprises CuAl.

19. The method for forming the via as claimed in claim 17, wherein the barrier layer or anti-reflective layer comprises TiN.

* * * * *